(12) United States Patent
Hirano

(10) Patent No.: US 6,768,259 B2
(45) Date of Patent: Jul. 27, 2004

(54) DISPLAY APPARATUS

(75) Inventor: Takashi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 181 days.

(21) Appl. No.: 09/878,878

(22) Filed: Jun. 11, 2001

(65) Prior Publication Data

US 2002/0036462 A1 Mar. 28, 2002

(30) Foreign Application Priority Data

Jun. 13, 2000 (JP) ........................................ P2000-176215

(51) Int. Cl.[7] ........................... H05B 33/10; H05B 33/14
(52) U.S. Cl. ........................... 313/506; 313/504; 428/917
(58) Field of Search ................................. 313/506, 504, 313/507, 111; 257/643, 59, 72, 350; 428/917

(56) References Cited

U.S. PATENT DOCUMENTS 6,456,279 B1 * 9/2002 Kubo et al. .................. 345/173
6,518,594 B1 * 2/2003 Nakajima et al. ............. 257/59

* cited by examiner

Primary Examiner—Ashok Patel
(74) Attorney, Agent, or Firm—Sonnenschein, Nath & Rosenthal LLP

(57) ABSTRACT

A display apparatus comprising an interlayer insulation film provided on a substrate in the condition of covering recesses and projections due to a wiring on the substrate, and an organic EL device provided on the interlayer insulation film, wherein the interlayer insulation film comprises a flattening insulation layer formed in the condition of embedding the wiring, and a coat layer formed in the condition of covering the surface of the flattening insulation layer. The flattening insulation layer is a coat film made from an organic compound-containing material, for example, spin on glass or a resin material, and the coat layer is a film of an inorganic material.

6 Claims, 3 Drawing Sheets

DISPLAY APPARATUS

RELATED APPLICATION DATA

The present and foregoing application claim priority to Japanese Application No. P2000-176215 filed Jun. 13, 2000. All of the foregoing applications are incorporated herein by reference to the extent permitted by law.

BACKGROUND OF THE INVENTION

The present invention relates to a display apparatus, and particularly to a display apparatus suitable for an active matrix type organic electroluminescence display using an organic electroluminescence device as a display device.

An organic electroluminescence device utilizing electroluminescence (hereinafter referred to as "EL") of an organic material comprises an organic layer in which an organic positive hole transport layer and an organic luminescence layer are laminated between an anode and a cathode, and is paid attention to as a light emitting device capable of high luminance light emission by a low voltage DC driving.

Of display apparatuses using such an organic EL device as a display device, an active matrix type display apparatus comprising a thin film transistor (hereinafter referred to as "TFT") for driving an organic EL device at each pixel comprises a flattening insulation film in the condition of covering the TFT and a wiring provided on a substrate, and the organic EL device is provided on the flattening insulation film. The organic EL device and the wiring are connected to each other through a contact hole provided in the flattening insulation film.

As the flattening insulation film, as disclosed, for example, in Japanese Patent Laid-open No. Hei 10(1998)-189252, there have been used a film provided by spin coating of a resin material such as a polyimide, and a film produced by building up a silicon oxide-based material film or a silicon nitride-based material film by CVD (Chemical Vapor Deposition), followed by polymer coating and etching back the entire surface by RIE (Reactive Ion Etching).

However, these display apparatuses have the following problems.

Namely, the flattening insulation film formed by coating such as spin coating consists mostly of an organic material or contains an organic material, and, therefore, has a high water-absorbing property. For example, a polyimide film formed by coating using a commercially available coating liquid has a water absorption coefficient as high as about 1 to 3%. Since the organic EL device used as a display device has a light-emitting portion composed of an organic material, absorption of moisture would result in lowering of luminance or a rise of driving voltage. Therefore, where a material high in moisture absorption property as above is used as a flattening insulation film, moisture gradually released from the flattening insulation film has a heavy effect on the display performance of the display device, and, therefore, sufficient long-term reliability as display apparatus cannot be obtained. In addition, since the deterioration of the display device due to moisture absorption proceeds also in the process of producing the display apparatus, the release of moisture from the flattening insulation film causes lowering of the yield of the display apparatus.

On the other hand, in the case of formation of the flattening insulation film by CVD method and etching back using RIE, it is difficult to obtain a flatness sufficient for the organic EL device provided later on the flattening insulation film. Particularly, in the case of etching back the entire surface by RIE, weak portions of the film to be etched are etched selectively. Therefore, although large recesses and projections formed by embedding a wiring or the like are alleviated, etching of an initial surface of the film to be etched which is not perfectly flat proceeds so that the grain shape of the film being etched is exaggerated, and the flatness of the etched-back film is further damaged. In addition, where a substrate with a large area is used, it is very difficult to obtain a uniform flatness over the entire surface of the substrate.

Where a display device is provided on the flattening insulation film having such an insufficient flatness, it is difficult to obtain a uniform film thickness of each layer constituting the display device, and it is difficult to obtain uniform display characteristics. Particularly, since a light-emitting portion of the organic EL device used as the display device is composed of an extremely thin organic film, dispersion of film thickness would affect the display characteristics. For example, there would arise troubles such as leakage of current due to local concentration of electric field at a small film thickness portion at the time of driving, and it is difficult to accomplish stable display.

SUMMARY OF THE INVENTION

Accordingly, it is an object of the present invention to solve the above-mentioned problems and to provide a display apparatus suitable for an active matrix type display apparatus excellent in yield and long-term reliability.

According to the present invention, there is provided a display apparatus including an interlayer insulation film provided on a substrate in the condition of covering recesses and projections of the substrate, and a display device provided on the interlayer insulation film, wherein the interlayer insulation film includes a flattening insulation layer made from an organic compound-containing material and formed in the condition of embedding the recesses and projections, and a coat layer consisting of an inorganic material and formed in the condition of covering the surface of the flattening insulation layer.

With this configuration, since the flattening insulation layer is constituted of an organic compound-containing material, the flattening insulation layer can be provided as a coat film having excellent flatness. Therefore, the flattening insulation layer together with the coat layer provides an interlayer insulation film excellent in flatness, and the display device can be provided on the interlayer insulation film, so that the film thickness of each layer constituting the display device is made to be uniform. In addition, since the coat layer is composed of an inorganic material, the coat layer functions as a barrier against gas components (for example, water vapor) released from the organic material constituting the flattening insulation layer, and supply of the gas components (particularly, water vapor) to the side of the display device provided on the coat layer is prevented, whereby deterioration of the display device due to moisture absorption is prevented.

Thus, as detailed below, according to the display apparatus of the present invention, the display device is provided on an interlayer insulation film having a multiplayer structure comprising a flattening insulation layer and a coat layer, whereby it is possible to stabilize the display characteristics of the display device provided through the interlayer insulation film on a substrate having recesses and projections due to a wiring such as, for example, a substrate of an active matrix type display apparatus, and it is possible to prevent deterioration due to moisture absorption. Therefore, it is possible to contrive a higher yield and a higher long-term reliability of the display apparatus.

The above and other objects, features and advantages of the present invention will become apparent from the following description and the appended claims, taken in conjunction with the accompanying drawings which show by way of example some preferred embodiments of the invention.

DETAILED DESCRIPTION OF THE PREFERRED EMBODIMENTS

Figure 1:
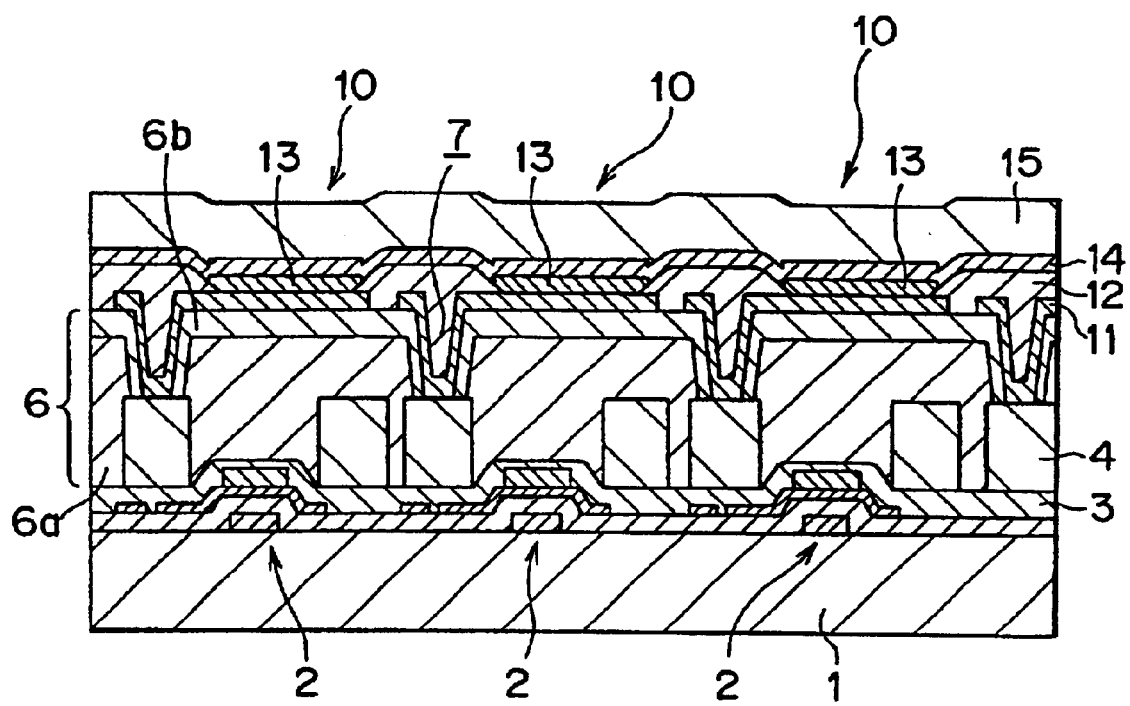
FIG. 1 is a sectional view showing an example of constitution of a display apparatus according to the present invention.

Hereinafter, an embodiment of the display apparatus according to the present invention will be described referring to the drawings. Here, one embodiment of applying the present invention to an active matrix type display apparatus using an organic EL device as a display device will be described.

The display apparatus shown in FIG. 1 comprises TFTs 2 of the bottom gate type (top gate type may also be adopted) provided in the form of a matrix on a substrate 1 consisting, for example, of a glass material, and an insulation film 3 formed in the condition of covering the TFTs 2. On the insulation film 3, a wiring 4 connected to the TFTs 2 through contact holes (not shown) are provided, and the wiring 4 provides the largest recesses and projections on the surface of the substrate 1.

On the insulation film 3, an interlayer insulation film 6 is provided in the condition of embedding the wiring 4. The interlayer insulation film 6 has a mutilayer structure comprising a flattening insulation layer 6a formed on the insulation film 3 in the condition of embedding the wiring 4, and a coat layer 6b provided on the flattening insulation layer 6a. Here, the flattening insulation layer 6a consists of a material obtained by use of an organic matter such as SOG or resin material (for example, polyimide resin, acrylic resin, or organic silica film), and is a coat film formed by a coating method such as a spin coating method. On the other hand, the coat layer 6b is formed by use of an insulating material having a gas barrier property for restraining release of gas from the flattening insulation layer 6a. The coat layer 6b is provided to have a single-layer or multilayer structure by use of an inorganic material such as silicon oxide, silicon nitride ($Si_3N_4$), amorphous silicon ($\alpha$-Si) or aluminum oxide ($Al_2O_3$). In addition, the coat layer 6b has a film thickness sufficient for restraining release of gas from the flattening insulation layer 6a.

Figure 2:
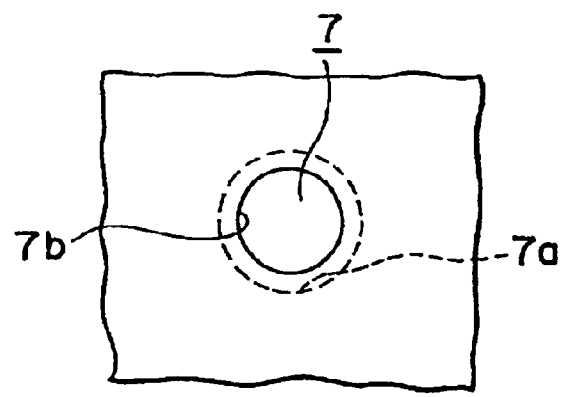
FIG. 2 is a plan view of major part showing an example of constitution of a display apparatus according to the invention.

The interlayer insulation film 6 with such a multilayer structure is provided with contact holes 7 reaching the wiring 4. The side circumferential walls of the contact holes 7 are covered with the coat layer 6b, and the top surface and surfaces fronting on the contact holes 7 of the flattening insulation layer 6a are entirely covered with the coat layer 6b. Therefore, as shown in FIG. 2, opening portions 7b of the coat layer 6b are provided on the inside of bottom surface openings of opening portions 7a formed in the flattening insulation layer 6a. While the contact hole 7 in FIG. 2 has a circular opening shape, the opening shape of the contact holes 7 is not limited to this, and may be rectangular (including square) or polygonal.

Organic EL devices 10 are provided on the interlayer insulation film 6 in the condition of being connected to the wiring 4 through the contact holes 7. The organic EL device 10 is of, for example, top luminescence type for emitting light from a side opposite to the substrate 1, and comprises a lower electrode 11 connected to the wiring 4 through the contact hole 7, an insulation layer 12 provided in the condition of covering the periphery of the lower electrode 11, an organic layer 13 provided on the lower electrode 11, and an upper electrode 14 and a transparent electrode 15 provided on the organic layer 13. The organic EL device 10 may be of a transmission type in which light is taken out from the side of the substrate 1.

Next, details of component elements of the display apparatus will be described in the order of formation steps, using the sectional process charts shown in FIGS. 3A to 3D and 4A to 4C.

Figure 3A:
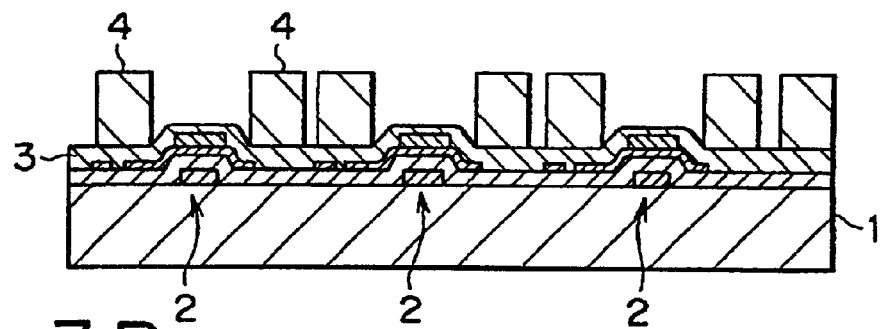
FIGS. 3A to 3D are sectional process charts (first) showing the procedures of production of the display apparatus according to an embodiment.

First, as shown in FIG. 3A, bottom gate type TFTs 2 are provided on a substrate 1 consisting, for example, of a transparent glass, and an insulation film 3 is provided in the condition of covering the TFTs 2. Next, the insulation film 3 is provided with contact holes (not shown here), and a wiring 4 to be connected to the TFTs 2 through the contact holes is provided on the insulation film 3. The wiring 4 is for connecting the TFTs 2 to each other, or connecting organic EL devices formed in later steps and the TFTs 2, and is formed as an aluminum wiring with a height of, for example, about 1.0 $\mu$m. The shape of the wiring 4 is the greatest cause of recesses and projections in the surface of the substrate 1.

Figure 3B:
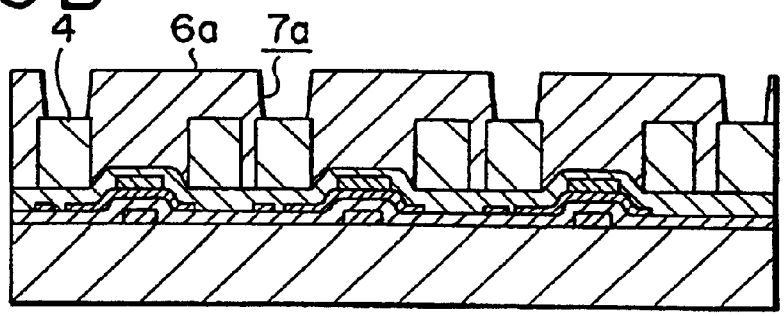

Next, as shown in FIG. 3B, in order to flatten the recesses and projections arising from the formation of the wiring 4, a flattening insulation layer 6a is formed on the insulation film 3 with the wiring 4 formed thereon, in the condition of embedding the recesses and projections due to the wiring 4. The flattening insulation layer 6a consists of a positive-type photosensitive polyimide. The formation of the flattening insulation layer 6a on the insulation film 3 is carried out by applying the photosensitive polyimide by a spin coating method at a revolution number of 3200 rpm. Immediately after the coating, the flattening insulation layer 6a is prebaked on a hot plate at 90° C. for 10 minutes. The coat film thickness of the flattening insulation layer 6a after the prebaking is about 2.4 $\mu$m, and the wiring 4 is embedded in the flattening insulation layer 6a.

Thereafter, pattern exposure of the flattening insulation layer 6a is carried out by using an exposure apparatus, whereby exposed portions are made soluble in a developing liquid. The pattern exposure is carried out, for example, by use of a proximity exposure apparatus at an exposure amount of 500 mJ.

The flattening insulation layer 6a after pattern exposure is developed by use of a shower rotation type developing apparatus, whereby exposed portions are dissolved in the developing liquid and removed. As the developing liquid, an aqueous 2.38% solution of TMAH (tetramethylammonium hydroxide) (for example, MND-3 produced by TOKYO OHKA KOGYOU CO., LTD.) is used, and developing time is about 3 minutes.

By the above series of lithographic treatments, the flattening insulation layer 6a is patterned in a predetermined shape, and opening portions 7a reaching the wiring 4 are provided.

Thereafter, baking for causing imidization (cyclization) of the photosensitive polyimide constituting the flattening insulation layer 6a is carried out in a clean baking furnace. In this case, baking is carried out in a nitrogen atmosphere at 170° C. for 60 minutes, and baking is carried out at 350° C. for 30 minutes. The film thickness of the flattening insulation layer 6a after the baking is about 2.0 µm, and the wiring 4 is embedded in the flattening insulation layer 6a. In this case, the flatness (maximum height difference between recesses and projections) of the surface of the flattening insulation layer 6a is about 0.3 µm, and water absorption coefficient is about 1.5 wt. %

The flattening insulation layer 6a is not limited to the above-mentioned photosensitive polyimide, as far as it is a coat film formed by a coating method such as spin coating, and may be a film of a resin material not photosensitive or an SOG film. Where the flattening insulation layer 6a is formed by use of a material not photosensitive, however, a resist pattern is provided on the thus formed flattening insulation layer 6a, and the flattening insulation layer 6a is etched by using the resist pattern as a mask, to produce the opening portions 7a.

Figure 3C:
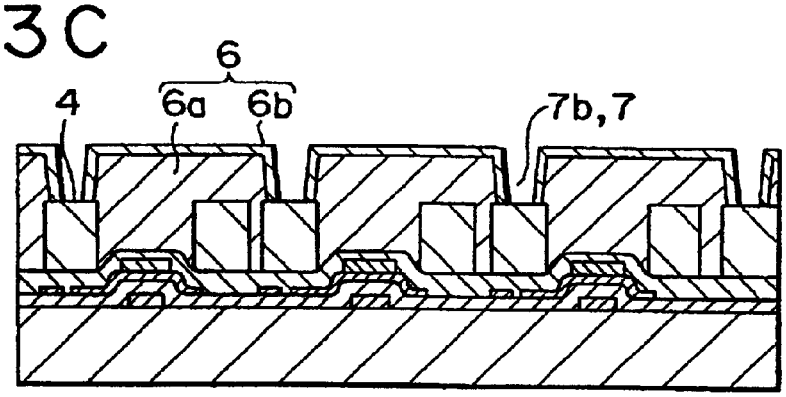

After the flattening insulation layer 6a is thus provided with the opening portions 7a, a coat layer 6b is provided in the condition of covering the exposed surfaces of the flattening insulation layer 6a inclusive of inside walls of the opening portions 7a, as shown in FIG. 3C. Here, the coat layer 6b consisting of silicon oxide ($SiO_2$) is formed by plasma CVD. In this case, silane ($SiH_4$) and nitrous oxide ($N_2O$) are used as reactive gases, and film formation is carried out at a film-forming temperature of 320° C. and a film-forming atmospheric pressure of 50 Pa. Thus, the coat layer 6b consisting of silicon oxide having a film thickness ensuring a sufficient gas barrier property and easy processing (here, 500 nm) is provided. While the method of forming the coat layer 6b is not limited to the plasma CVD method, it is desirable to apply a film-forming method by which a film with a sufficient gas barrier property can be obtained.

Next, a resist pattern (not shown here) is provided on the coat layer 6b, and the coat layer 6b at bottom surfaces of the opening portions 7a formed in the flattening insulation layer 6a is etched away using the resist pattern as a mask, whereby the coat layer 6b is provided with opening portions 7b. In this case, as shown in FIG. 2, the opening portion 7b of the coat layer 6b is provided on the inside of the bottom opening of the opening portion 7a formed in the flattening insulation layer 6a. The etching of the coat layer 6 consisting of silicon oxide is carried out by wet etching using, for example, a mixed solution of hydrofluoric acid and ammonium fluoride or dry etching using a fluorine-containing gas (for example, methane tetrafluoride, $CF_4$).

By the above procedure, while the condition of covering the exposed surfaces of the flattening insulation layer 6a with the coat layer 6b is maintained, the interlayer insulation film 6 composed of the flattening insulation layer 6a and the coat layer 6b covering it is provided with contact holes 7 reaching the wiring 4.

The method of forming the interlayer insulation film 6 composed of the flattening insulation layer 6a and the coat layer 6b covering it and provided with the contact holes 7 having side circumferential walls covered with the coat layer 6b is not limited to the above procedures, and may be carried out by the following procedures.

First, a flattening insulation layer and a coat layer are provided, and then the flattening insulation layer and the coat layer are provided with contact holes reaching the wiring by etching using a resist pattern as a mask. Next, a second coat layer is provided in the condition of covering the internal walls of the contact holes, and the second coat layer is etched back in the condition where side walls consisting of the second coat layer are left on the internal walls of the contact holes. By this, there is obtained a flattening insulation film in which the upper side of the flattening insulation layer is covered with the coat layer and the internal walls of the contact holes are covered with the second coat layer. According to such a method, it suffices that the formation of the resist pattern for forming the contact holes is carried out only once, and the number of masking steps can be reduced. In addition, mask matching is not needed, which is suitable for minuter designs.

After the interlayer insulation film 6 provided with the contact holes 7 reaching the wiring 4 is formed by a method selected from the above methods, organic EL devices 10 are provided on the interlayer insulation film 6 (namely, on the coat layer 6b) in the following manner. While the case of providing the organic EL devices of the top luminescence type in which light is discharged from the side opposite to the substrate 1 will be described as an example, the present invention is not limited to the example, and organic EL devices of the transmission type in which light is taken out from the side of the substrate 1 may be provided.

Figure 3D:
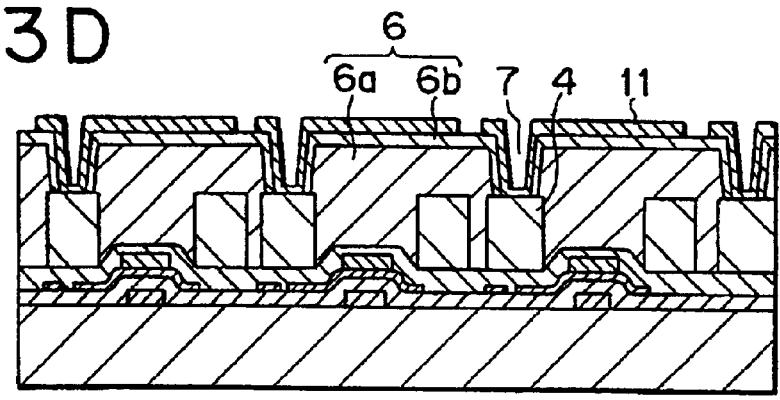

First, as shown in FIG. 3D, a lower electrode 11 consisting of a metal (for example, Cr) is provided on the coat layer 6b in the condition of being connected to the wiring 4 through the contact hole 7. The lower electrode 11 is used as an anode of the organic EL device.

To provide the lower electrode 7, first, a chromium (Cr) film with a thickness of 200 nm is formed by a DC sputtering method. In this case, for example, argon (Ar) is used as the sputter gas, and film formation is carried out by setting the sputtering atmospheric pressure of 0.2 Pa and a DC output of 300 W. Next, the chromium film is etched using a resist pattern formed by ordinary lithographic technique as a mask, whereby the lower electrode 11 consisting of chromium patterned in a predetermined shape is obtained.

The etching of the chromium film is carried out by wet etching using an etching liquid based on a mixed aqueous solution of ammonium ceric sulfate and perchloric acid, for example, ETCH-1 (trade name, product by Sanyo Chemical Industries, Ltd.), whereby etching with high precision and good reproducibility is performed. If a further higher precision is required, dry etching is carried out. In the case of dry etching, for example, a mixed gas of chlorine ($Cl_2$) and oxygen ($O_2$) is used as an etching gas. In this case, particularly, RIE (Reactive Ion Etching) may be carried out, whereby it is possible to process with high precision and to control the shape of the side walls being etched. For example, by etching under predetermined etching conditions, the side walls being etched can be tapered, so that the possibility of short circuit between the lower electrode 11 and an upper electrode provided in the later steps can be reduced.

Figure 4A:
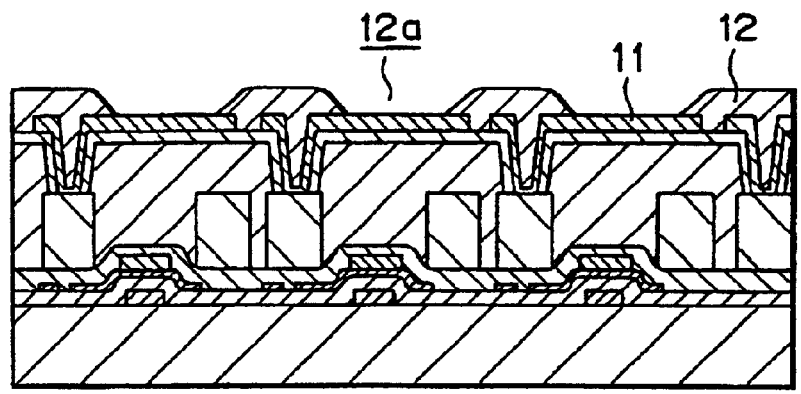
FIGS. 4A to 4C are sectional process charts (second) showing the procedures of production of the display apparatus according to an embodiment.

As shown in FIG. 4A, an insulation layer 12 having opening portions 12a on the upper side of the lower electrodes 11 and covering the peripheral edges of the lower electrodes 11 is provided. The material for constituting the insulation layer 12 is not particularly limited, and, for example, silicon oxide ($SiO_2$) is used here.

In order to provide the insulation layer 12, first, a silicon oxide film with a thickness of 200 nm is provided, for example, by sputtering, and a resist pattern is provided on the silicon oxide film by ordinary lithographic technique. Thereafter, the silicon oxide film is etched using the resist pattern as a mask, whereby the insulation layer 12 having the opening portions 12a on the upper side of the lower electrodes 11 and covering the peripheral edges of the lower electrodes 11 is obtained. The etching may be wet etching using a mixed aqueous solution of hydrofluoric acid and ammonium fluoride, or dry etching. The insulation layer 12 may be formed according to necessity, and when the insulation layer 12 is provided, it is possible to prevent short circuit between the lower electrodes 11 and upper electrodes which will be provided in a later step. Where the insulation layer 12 is provided, the opening portions 12a of the insulation layer 12 correspond to luminescence portions of the organic EL devices.

Figure 4B:
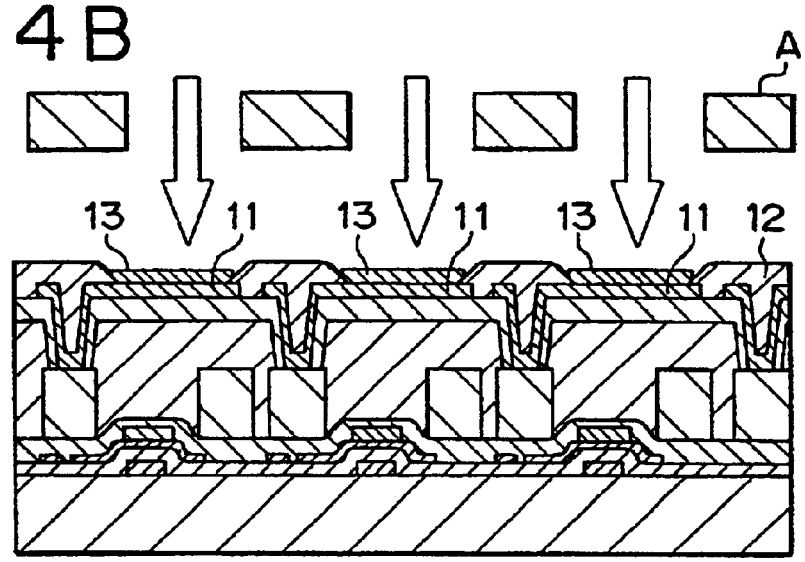

Next, as shown in FIG. 4B, the substrate provided with the insulation layer 12 as required is placed into a vacuum vapor deposition apparatus, and vacuum vapor deposition is carried out from the upper side of a mask A to provide an organic layer 13 which covers the lower electrodes 11 in an individually independent state. The mask A is so designed that edge portions of the insulation layer 12 are also covered by the organic layer 13, whereby the lower electrodes 11 are completely covered by the organic layer 13. The organic layer 13 has a laminated structure of an organic positive hole injection layer, an organic positive hole transport layer, and an organic luminescent layer serving also as an electron transport layer, which are not shown here and are sequentially provided in this order from the lower side.

As one example of the organic layer 13 with such a structure as above, a layer of MTDATA 4,4',4"-tris(3-methylphenylphenylamino)triphenylamine is provided in a film thickness of 30 nm as the organic positive hole injection layer, a layer of α-NPD [bis(N-naphthyl)-N-phenylbenzidine] is provided in a film thickness of 20 nm as the organic positive hole transport layer, and a layer of Alq3 (8-quinolinol aluminum complex) is provided in a film thickness of 50 nm as the organic luminescent layer.

In the vacuum vapor deposition of the organic layer 13, 0.2 g of each material is packed in each boat for resistance heating, which is fitted to predetermined electrodes of a vacuum vapor deposition apparatus, vapor deposition atmospheric pressure is reduced to $1.0 \times 10^{-4}$ Pa, and a voltage is impressed on each boat to sequentially vapor-deposit the material in the boat. As the mask A, a metallic mask is used.

Figure 4C:
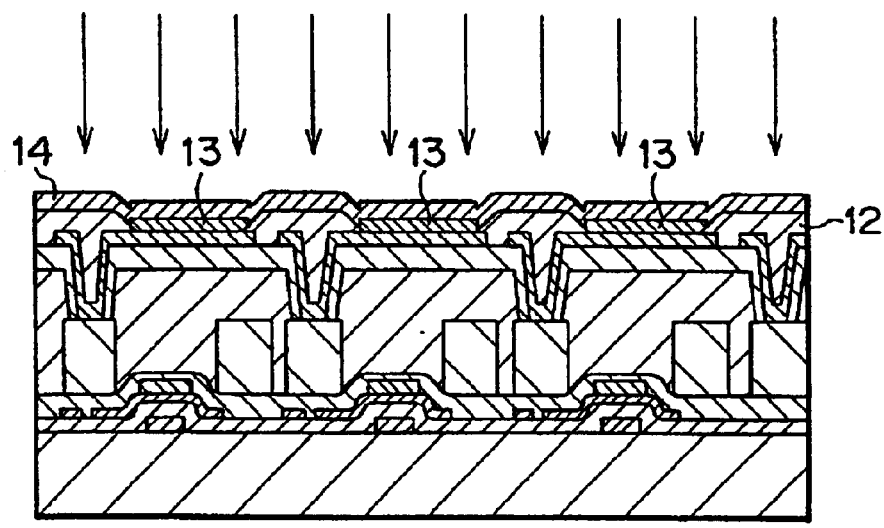

Next, as shown in FIG. 4C, the mask is removed, and vapor deposition is carried out to form an upper electrode 14 covering the organic layer 13 and the insulation layer 12 over the entire surface of the upper side of the substrate 1. The upper electrode 14 is used as a cathode of the organic EL device, and is constituted, for example, of an alloy of magnesium (Mg) and silver (Ag). The film thickness of the upper electrode is, for example, 10 nm. The vacuum vapor deposition of the upper electrode 14 is carried out continuously in the vacuum vapor deposition apparatus in which the vapor deposition of the organic layer 13 has been carried out.

In the vacuum vapor deposition of the upper electrode 14, 0.1 g of magnesium and 0.4 g of silver are packed in boats, which are fitted to predetermined electrodes in the vacuum vapor deposition apparatus, then vapor deposition atmospheric pressure is reduced to $1.0 \times 10^{-4}$ Pa, and a voltage is applied to each boat to co-deposit magnesium and silver contained in the boats. In this case, the ratio of film-forming rates of magnesium to silver is set to be about 9:1.

Thereafter, as shown in FIG. 1, a transparent electrode film 15 is provided on the upper electrode 14. Here, as the transparent electrode film 15, a transparent conductive material based on indium zinc oxide (In—Zn—O) showing good conductivity when formed into film at room temperature is used. The formation of the film of the transparent electrode film 15 consisting of such a material is carried out, for example, by DC sputtering method. As one example of the film formation, a mixed gas of argon (Ar) and oxygen ($O_2$) (volume ratio Ar:$O_2$=1000:5) is used as the sputter gas, a sputtering atmospheric pressure is 0.3 Pa, a DC output is 40 W, and the film thickness of the transparent electrode film 15 is 200 nm.

In the manner as above, a plurality of organic EL devices 10 having a laminated structure of the lower electrode (anode) 11, the organic layer 13, the upper electrode (cathode) 14 and the transparent electrode film 15 are sequentially provided on the interlayer insulation film 6 as display devices. Each of the organic EL devices 10 is connected to the TFT 2 through the contact hole 7 provided in the interlayer insulation film 6 and the wiring 4.

In addition, in the manner as above, an active matrix type display apparatus in which each organic EL device 10 provided as the display device is connected with the TFT 2 for driving the organic EL device 10 is obtained.

In the display apparatus constituted as above, the flattening insulation layer 6a is formed by a coating method such as spin coating method and is, therefore, excellent in flatness, and the wiring 4 is embedded in the interlayer insulation film 6 excellent in flatness which is composed of the flattening insulation layer 6a and the coat layer 6b covering it. Then, the organic EL devices 10 can be provided on the interlayer insulation film 6 excellent in flatness. Therefore, the organic EL device 10 has thin films of the organic layer excellent in film thickness uniformity, whereby short circuit between the lower electrode 11 and the upper electrode 14 is prevented, uniformity of luminescence in a luminescent plane can be contrived, and stable display characteristics can be ensured.

Moreover, since the coat layer 6b covering the flattening insulation layer 6a is formed of an inorganic material, the coat layer 6b functions as a barrier against gas components (for example, water vapor) released from the flattening insulation layer 6a provided as a coat film, and discharge of the gas components (particularly, water vapor) to the side of the organic EL devices provided on the coat layer 6b is prevented. In addition, since the side circumferential walls of the contact holes 7 provided in the interlayer insulation film 6 are covered by the coat layer 6b, discharge of moisture from the side circumferential walls of the contact holes 7 to the side of the organic EL devices 10 is also prevented. Therefore, it is possible to prevent the deterioration of the organic EL devices 10 due to moisture absorption during production steps and to prevent the deterioration of the organic EL devices 10 due to moisture absorption during long-term driving. As a result of the above, it is possible to contrive an enhanced yield and an enhanced long-term reliability of an active matrix type display apparatus.

Besides, since the side circumferential walls of the contact holes 7 provided in the interlayer insulation film 6 are covered by the coat layer 6b, deterioration of the organic EL devices 10 due to moisture absorption can be prevented even where the organic EL devices 10 are provided on the upper side of the contact holes 7.

Next, evaluation results of the display apparatus obtained as above will be shown. Here, as a working example, for display devices (organic EL devices) of the display apparatus constituted as described in the embodiment above, driving voltage, driving current, luminance at the time of initial driving, and luminance after driving for 100 hours in air were measured. In addition, as a comparative example 1, each value was measured for organic EL devices provided directly on the substrate. Further, as a comparative example 2 corresponding to the display apparatus having a conventional structure, each value was measured for organic EL devices provided directly on an interlayer insulation film composed only of a flattening insulation layer. The results of measurement are shown in Table 1 below. The flattening insulation layer and organic EL devices in the comparative examples 1 and 2 were formed in the same manner as those in the display apparatus of the working example.

TABLE 1

|  | Driving voltage | Driving current | Initial luminance | Luminance after 100 hr |
|---|---|---|---|---|
| Working example | 8.9 V | 39 mA/cm$^2$ | 990 cd/m$^2$ | 955 cd/m$^2$ |
| Comparative example 1 | 8.9 V | 39 mA/cm$^2$ | 1000 cd/m$^2$ | 970 cd/m$^2$ |
| Comparative example 2 | 11.2 V | 39 mA/cm$^2$ | 560 cd/m$^2$ | 270 cd/m$^2$ |

As shown in Table 1, the luminance at the time of initial driving (initial luminance) of the organic EL device of the working example is found to be kept at a high level similar to that of the organic EL device of the comparative example 1 in which the interlayer insulation film is not provided. In contrast, the corresponding value of the organic EL device of the comparative example 2 formed directly on the flattening insulation layer is lower as compared with those of the organic EL devices of the working example and the comparative example 1. From these results, it has been confirmed that provision of the coat layer on the flattening insulation layer in the display apparatus of the working example restrains the release of moisture from the flattening insulation layer to the side of the organic EL device during production steps, and prevents deterioration of the organic EL device due to moisture absorption. Therefore, it has been confirmed that the display apparatus of the working example is enhanced in yield as compared with the display apparatus according to the prior art.

In addition, the luminance after driving 100 hours (luminance after 100 hr) of the organic EL device of the working example is found to be kept at a high level similar to that of the organic EL device of the comparative example 1. In contrast, the corresponding value of the organic EL device of the comparative example 2 formed directly on the flattening insulation layer is lower as compared to those of the organic EL devices of the working example and the comparative example 1. From these results, it has been confirmed that provision of the coat layer on the flattening insulation layer in the display apparatus of the working example restrains the release of moisture from the flattening insulation layer to the side of the organic EL device during long-term driving, and prevents deterioration of the organic EL device due to moisture absorption. Therefore, it has been confirmed that the display apparatus of the working example is superior to the display apparatus of the prior art in long-term reliability.

While a preferred embodiment of the invention has been described using specific terms, such description is for illustrative purpose only, and it is to be understood that changes and variations may be made without departing from the spirit or scope of the following claims.

What is claimed is:

1. A display apparatus, comprising:

a substrate having recesses and projections;

an interlayer insulation film provided on said substrate so that the interlayer insulation film covers the recesses and projections of said substrate; and a display device provided on said interlayer insulation film, wherein said interlayer insulation film comprises:

a flattening insulation layer made from an organic compound-containing material and formed so that said flattening insulation layer embeds said recesses and projections; and a coat layer consisting of an inorganic material and formed so that the coat layer covers the surface of said flattening insulation layer.

2. A display apparatus as set forth in claim 1, wherein said display device is an organic electroluminescence device.

3. A display apparatus as set forth in claim 1, wherein said flattening insulation layer is made from a coat film.

4. A display apparatus as set forth in claim 1, wherein said flattening insulation layer is made from spin on glass or a resin material.

5. A display apparatus as set forth in claim 1, wherein said interlayer insulation film is provided with a contact hole reaching to a lower layer of said interlayer insulation film, said contact hole having a side circumferential wall, and said coat layer is formed to cover the side circumferential wall of said contact hole.

6. A display apparatus as set forth in claim 1, wherein said coat layer restrains the release of gas from said flattening insulation layer.

* * * * *